(12) United States Patent
Liu et al.

(10) Patent No.: US 6,608,778 B1
(45) Date of Patent: Aug. 19, 2003

(54) METHOD FOR OPERATING A NROM DEVICE

(75) Inventors: Cheng-Jye Liu, Taoyuan Hsien (TW); Tai-Liang Hsiung, Hsinchu (TW); Chia-Hsing Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,800

(22) Filed: Aug. 19, 2002

(51) Int. Cl.⁷ .............................................. G11C 16/04
(52) U.S. Cl. .......................... 365/185.28; 365/185.18; 365/185.26; 365/185.27
(58) Field of Search ................ 365/185.28, 185.18, 365/185.26, 185.27

(56) References Cited

U.S. PATENT DOCUMENTS

| | | | | |
|---|---|---|---|---|
| 5,617,357 A | * | 4/1997 | Haddad et al. ........ | 365/185.27 |
| 5,629,893 A | * | 5/1997 | Tang et al. ............. | 365/185.29 |
| 5,757,045 A | * | 5/1998 | Tsai et al. .............. | 257/336 |
| 6,185,133 B1 | * | 2/2001 | Chan et al. ............ | 365/185.29 |
| 6,407,947 B2 | * | 6/2002 | Ahn et al. .............. | 365/185.29 |
| 6,469,939 B1 | * | 10/2002 | Wang et al. ........... | 365/185.28 |

* cited by examiner

*Primary Examiner*—David Nelms
*Assistant Examiner*—Connie C. Yoha
(74) *Attorney, Agent, or Firm*—Jiang Chyun IP Office

(57) ABSTRACT

The present invention provides a method for operating a NROM device, where the source and drain are surrounded by a heavy doping. When programming the NROM device, a more positive source bias and a more negative substrate bias is used to increase the body effect of the substrate for reducing the current require for Channel Hot Electron Injection (CHEI) programming. Furthermore, before erasing the NROM array, a pre-programming operation is performed to program every single memory cell of the NROM array to the written state for preventing over-erasing of the memory cells.

17 Claims, 1 Drawing Sheet

METHOD FOR OPERATING A NROM DEVICE

BACKGROUND OF INVENTION

1. Field of the Invention

The present invention is generally related to a method for operating a memory device, and particularly to a method for operating a nitride read only memory device (referred as to NROM hereinafter).

2. Description of Related Art

Conventional NROM devices usually comprise of a oxide-nitride-oxide (ONO) stacked layer structure as the electron trapping layer, a gate is located above the ONO layer, and a source and drain neighbor to the gate located in the substrate. Due to the fact that the material of the electron trapping layer is mainly nitride, a device which allows electrons migration and electrically erasable programmable ROM is named as NROM.

The nitride layer has electron trapping properties causing the electrons that are injected into the nitride layer cannot be evenly distributed in the nitride layer but instead are gathered into a specific region of the nitride layer. Therefore when programming the NROM device, the electrons tend to accumulate in the channel near the source and above the drain. By varying the bias voltage of the source and drain next to the gate, a single nitride layer can accommodate two different groups of electrons. The nitride layer can contain two different groups of electrons, just one group of electrons, just an empty group, or a combination. As a result, the NROM device can have 4 different stages in one single cell known as a 1 cell 2 bit flash memory.

The size of semiconductor components are shrinking due to component integration and the advancement in technology. As a result, the line width of the gate of a NROM device also decreases to such a level that the operation of the NROM device is affected because a large current is required for programming. The problem is especially adverse when erasing the NROM device because the electrons injected into the channel near the source and above the drain cause a large amount of holes after repeated erasing of the cell. These holes will cause serious leakage in cells which share the same bit-line and word-line, especially under high temperature causing an effect known as over-erase. Furthermore if the initial voltage is lowered or the channel length is reduced, the above leakage problem becomes more severe.

SUMMARY OF INVENTION

The present invention provides a method for operating a NROM device to prevent the large number of holes located near the source and above drain causing serious leakage on the electrons of the neighbor bit-line.

The present invention provides a method for operating a NROM device for lowering the current required for channel hot electron injection (CHEI).

The present invention provides a method for operating a NROM device, where the source and drain are surrounded by a heavily doped substrate. When programming the NROM device, a more positive source bias and a more negative substrate bias is used to increase the body effect of the substrate for reducing the current required for Channel Hot Electron Injection (CHEI) programming. Furthermore, before the first erase operation is performed on the NROM array, a pre-programming operation is performed to program every single memory cell of the NROM array to the written state for preventing over-erasing of the memory cells.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
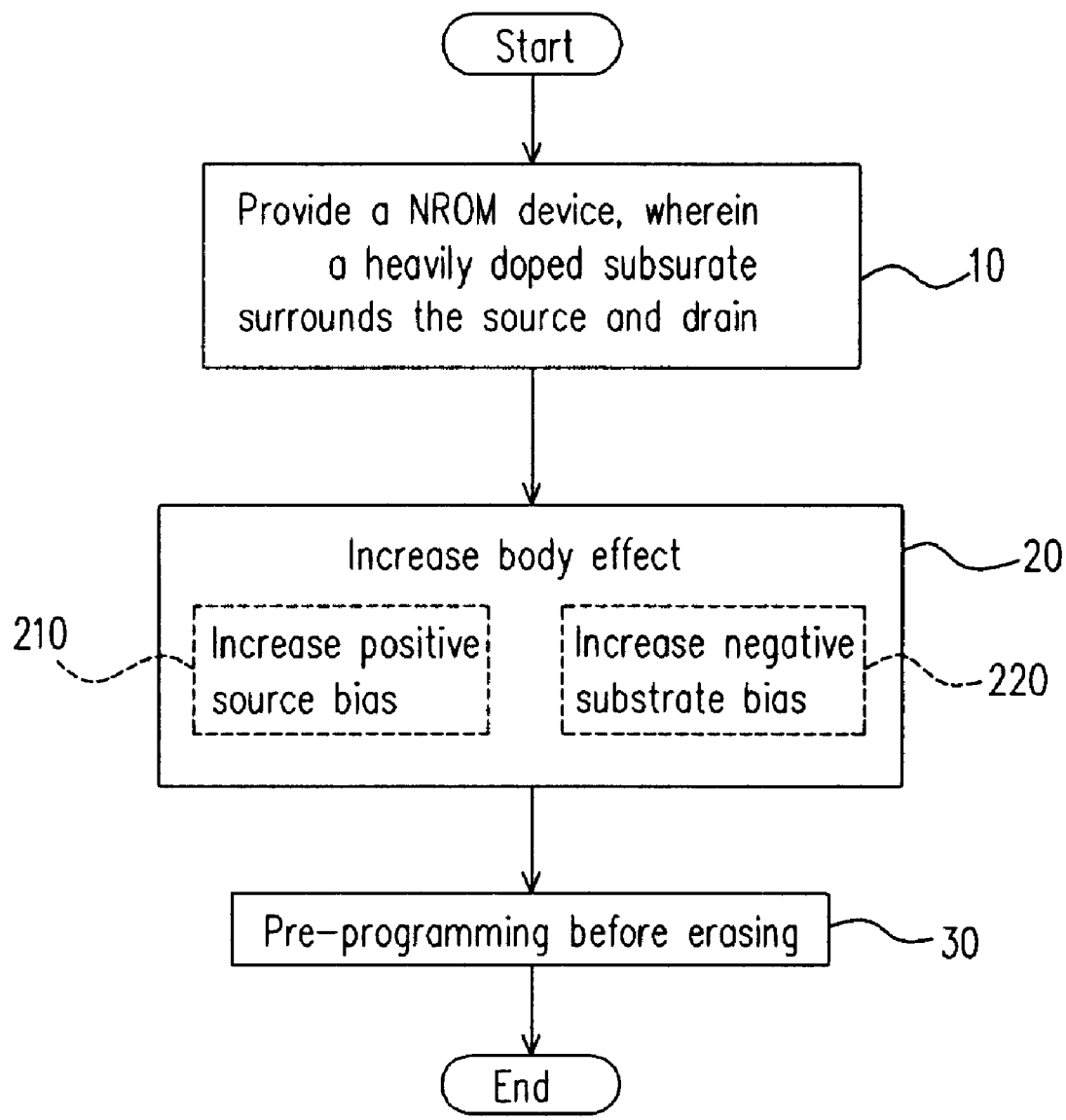
FIG. 1 is a flow chart diagram of the method for operating a NROM device according to a preferred embodiment of the present invention.

The preferred embodiment uses a nitride read only memory device (hereinafter known as NROM) as an example. As the size of components becomes gradually smaller, channel hot electron injection (hereinafter know as CHEI) has become dominant in the operation of a NROM device. The steps of operation are illustrated in FIG. 1.

Please refer to FIG. 1, step 10 denotes a NROM device with a heavily doped substrate surrounding the source and drain. The present invention successfully reduces the programming current without lowering the programming efficiency which is directly related to the programming current. As a result, the source and drain have to be surrounded by highly doped regions. The n+ source and drain are provided in a heavily doped substrate with increased doping concentration to improve programming efficiency. The methods for increasing doping concentration include cell implantation and pocket implantation.

Step 20 denotes the body effect of the substrate. When programming of the NROM device is performed by CHEI, increasing the body effect is a very effective way to reduce the current required for programming by CHEI. For example, the methods for increasing the body effect include using a more positive source bias such as a more positive source bias $V_S$ in step 210 or a more negative substrate bias $|V_B|$ in step 220.

Afterwards in step 30, a pre-program operation is performed before the erase operation to prevent the problem of over-erasing the NROM device by using injected hole as electron compensation. Therefore before the erase operation is performed, every single cell in that NROM array is programmed to the written state. The programming process can be performed by CHEI, F-N tunneling, or any other electron injection mechanism without limiting the present invention. The follow table 1 compares the method of operating a NROM device of the prior art with the present invention. [t1]

TABLE 1

|  | Prior Art | Present Invention |
|---|---|---|
| Initial voltage (Volts) | 1.3 | 2.5 |
| Programming Vg (volts) | 9~11 | 6 |
| Programming Vd (volts) | 6 | 6 |
| Programming Vs (volts) | 0 | 1~2 |
| Programming current ($\mu$A) | 350~400 | 50~100 |

From table 1, the present invention increases the source bias voltage Vs to decrease the required current for programming the NROM. The following table 2 shows the programming efficiency of the different operation methods.
[t2]

TABLE 2

|  | Current | Number of Cells | Time |
|---|---|---|---|
| Prior Art | 500 μA | 4 | 2 μs |
| Present Invention | 100 μA | 20 | 3 μs |

Although the present invention requires slightly more time, the longer time is insignificant because of the large number of cells that can be written each time, which is 5 times that of prior art. Programming efficiency is actually greatly improved with a reduced programming current.

The advantages of the present invention are as follow:

1. The use of a heavily doped substrate with increased doping concentration in the regions surrounding the source and drain for isolating the effect o the programming efficiency when the programming current is reduced.

2. A more positive source bias or a more negative substrate bias is supplied to increase the body effect for lowering the programming current for CHEI.

3. A pre-program operation is performed before the erase operation to program the individual cell into a written state to prevent leakage caused by the holes in the memory cells that have been erased repeatedly affecting the electrons in the neighbor bit-line.

4. The bias voltage of the gate, source, and drain is adjusted to increase the body effect. A pre-program operation is performed before the erase operation to prevent over-erasing and to increase programming efficiency.

It will be apparent to those skilled in the art that various modifications and variations can be made to the structure and method of the present invention without departing from the scope or spirit of the present invention. In view of the foregoing description, it is intended that the present invention covers modifications and variations of this invention provided they fall within the scope of the following claims and their equivalents.

What is claimed is:

1. A method for operating a NROM device comprising a gate, a source, a drain, and a substrate, wherein a surrounding of the source and the drain has an increased doping concentration, the method comprising:

increasing body effect to decrease a programming current of CHEI by either increasing the positive bias of the source or increasing the negative bias of the substrate, or by both increasing a positive bias of the source and increasing a negative bias of the substrate; and pre-programming each cell of the NROM device to a written state before an erase operation is performed.

2. The method of claim 1, wherein increasing body effect comprising a more positive source bias.

3. The method of claim 1, wherein increasing body effect comprising a more negative substrate bias.

4. The method of claim 1, wherein pre-programming each cell comprising CHEI.

5. The method of claim 1, wherein pre-programming each cell comprising F-N tunneling.

6. The method of claim 1, wherein pre-programming each cell comprising a mechanism for injecting electrons.

7. The method of claim 1, wherein increasing the doping concentration is selected from a group consisting of cell implantation and pocket implantation.

8. A method for operating a NROM device comprising a source, wherein a surrounding of the source has an increased doping concentration, the method comprising:

increasing body effect by increasing a bias voltage of the source to reduce a programming current of CHEI; and pre-programming each cell of the NROM device to a written state before an erase operation is performed.

9. The method of claim 8, wherein pre-programming each cell comprising CHEI.

10. The method of claim 8, wherein pre-programming each cell comprising F-N tunneling.

11. The method of claim 8, wherein pre-programming each cell comprising a mechanism for injecting electrons.

12. A method for operating a NROM device comprising a substrate, wherein the substrate comprising a heavily doped substrate with increased doping concentration, the method comprising:

increasing body effect by increasing a negative bias of the substrate to reduce a programming current of CHEI; and pre-programming each cell of the NROM device to a written state before an erase operation is performed.

13. The method of claim 12, wherein pre-programming each cell comprising CHEI.

14. The method of claim 12, wherein pre-programming each cell comprising F-N tunneling.

15. The method of claim 12, wherein pre-programming each cell comprising a mechanism for injecting electrons.

16. The method of claim 12, wherein increasing the doping concentration is selected from a group consisting of cell implantation and pocket implantation.

17. The method of claim 8, wherein increasing the doping concentration is selected from a group consisting of cell implantation and pocket implantation.

* * * * *